United States Patent [19]

Matsuura et al.

[11] Patent Number: 5,071,702
[45] Date of Patent: Dec. 10, 1991

[54] LAMINATED PLATE FOR HIGH FREQUENCY

[75] Inventors: Satoshi Matsuura; Kaoru Fujii, both of Kuga, Japan

[73] Assignee: Mitsui Petrochemical Industries, Ltd., Tokyo, Japan

[21] Appl. No.: 248,106

[22] Filed: Sep. 23, 1988

[30] Foreign Application Priority Data

Sep. 24, 1987 [JP] Japan .................. 62-237427

[51] Int. Cl.$^5$ .......... B32B 27/00; H05K 1/03
[52] U.S. Cl. .................. 428/290; 428/441; 428/461; 428/516; 156/300
[58] Field of Search ........ 428/441, 290, 461, 516

[56] References Cited

U.S. PATENT DOCUMENTS 3,617,666 11/1971 Braue ........................ 200/86
4,386,991 6/1983 Shiomi et al. .............. 428/516

FOREIGN PATENT DOCUMENTS 0112568 7/1984 European Pat. Off. .
2120771 11/1971 Fed. Rep. of Germany .
58-46691 3/1983 Japan .
1390545 4/1975 United Kingdom .

Primary Examiner—P. C. Sluby
Attorney, Agent, or Firm—Sherman and Shalloway

[57] ABSTRACT

A laminated plate for a high frequency comprising a reinforced plastic layer and a conductive layer bonded to an outermost layer of the reinforced plastic layer, wherein the reinforced plastic layer comprises reinforcing fibers impregnated with poly(4-methyl-1-pentene) at least partially graft-modified with an unsaturated carboxylic acid or a derivative thereof.

7 Claims, 1 Drawing Sheet

LAMINATED PLATE FOR HIGH FREQUENCY

BACKGROUND OF THE INVENTION

1. Field of the Invention

The present invention relates to a laminated plate for a high frequency and usable as, for example, electrical circuit substrates and a flat antenna.

2. Description of the Related Art

As a laminated plate for a high frequency to be used as a high frequency electrical circuit substrate a copper-laminated plate, comprising copper laminated by bonding to the outermost layer of a laminate having a prepreg impregnated with a resin laminated to reinforcing fibers such as glass fibers, has been used. As the resin material for such a laminated plate for a high frequency, a poly(4-methyl-1-pentene) has been proposed (Japanese Unexamined Patent Publication (Kokai) No. 58-46691). Poly(4-methyl-1-pentene) has excellent high frequency characteristics, such as a dielectric constant and dielectric loss, in the gigahertz zone, and thus is most appropriate for use as the resin material of a laminated plate for a high frequency.

Nevertheless, in such a prior art laminated plate for a high frequency, which employs poly(4-methyl-1-pentene) as such, impregnation of the reinforcing fibers is difficult, and therefore, the resin must be impregnated as a solution dissolved in a solvent, or laminated in a powdery form and then impregnated by heating and melting. When using a solvent, the process is dangerous and the workability is poor, and when impregnating in a powdery form, a problem arises in that it is difficult to effect a uniform impregnation. Also, poly(4-methyl-1-pentene) has a poor adhesiveness, and thus another problem arises in that an adhesive must be used for attaching a copper foil.

SUMMARY OF THE INVENTION

Accordingly, the objects of the present invention are to eliminate the above-mentioned problems of the prior art and to provide a laminated plate for a high frequency which can be easily impregnated and has a good adhesiveness to reinforcing fibers, and further, the preparation of the laminated plate and bonding of the conductor layer are easily conducted, and the laminated plate has an excellent flexural strength and flexural modulus.

Another object of the present invention is to provide a process for producing the above-mentioned laminated plate for a high frequency.

Other objects and advantages of the present invention will be apparent from the following description.

In accordance with the present invention, there is provided a laminated plate for a high frequency comprising a reinforced plastic layer and a conductive layer bonded to an outermost layer of the reinforced plastic layer, wherein the reinforced plastic layer comprises reinforcing fibers impregnated with poly(4-methyl-1-pentene) at least partially graft-modified with an unsaturated carboxylic acid or a derivative thereof.

In accordance with the present invention, there is also provided a process for producing a laminated plate for a high frequency comprising the steps of:

(i) laminating a film of a resin comprising a film of a poly(4-methyl-1-pentene) at least partially graft-modified with an unsaturated carboxylic acid or a derivative thereof and reinforcing fibers, followed by heating and pressurization to impregnate said reinforcing fibers with said resin, to thereby form a prepreg, and;

(ii) laminating a conductor layer, followed by heating and pressurization to effect bonding.

BRIEF DESCRIPTION OF THE DRAWINGS

The present invention will be better understood from the description set forth below with reference to the accompanying drawings; in which.

DESCRIPTION OF THE PREFERRED EMBODIMENTS

Figure 1:
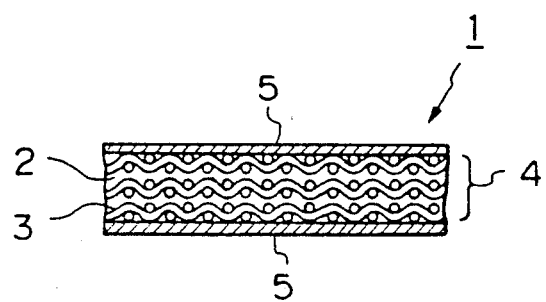
FIG. 1 is a sectional view showing an example of the laminated plate for a high frequency; and, FIG. 2 and FIG. 3 are sectional views showing the steps for producing same.

The resin usable in the present invention is a poly(4-methyl-1-pentene) at least partially graft-modified with an unsaturated carboxylic acid or a derivative thereof. This resin is a thermoplastic resin, and in the present invention, impregnation and bonding are effected by utilizing the thermoplastic property thereof.

The graft-modified poly(4-methyl-1-pentene), which is the constituent of the resin in the present invention, may contain a grafted amount of an unsaturated carboxylic acid or a derivative thereof in the range of 0.5% to 10% by weight, preferably 1% to 5% by weight, and have an intrinsic viscosity $[\eta]$ in decalin solvent at 135° C. of 0.3 to 10 dl/g, preferably 0.5 to 5 dl/g. A resin with a grafted amount of the unsaturated carboxylic acid or derivative thereof of less than 0.5% by weight will not show an improved impregnation of the reinforced fibers and interlayer adhesiveness to the conductor layer, and a resin with a grafted amount of over 10% by weight will show a reduced hydroscopic resistance.

The poly(4-methyl-1-pentene), which is the base material for the graft-modified poly(4-methyl-1-pentene) to be used in the present invention, may be a homopolymer of 4-methyl-1-pentene or a copolymer of 4-methyl-1-pentene with another $\alpha$-olefin having 2 to 20 carbon atoms, such as ethylene, propylene, 1-butene, 1-hexene, 1-octene, 1-decene, 1-tetradecene, 1-octadecene, but is generally a copolymer composed mainly of 4-methyl-1-pentene containing 85 mol % or more of 4-methyl-1-pentene, preferably a polymer which is crystalline, having a melting point according to an (ASTM D 3418) method of 230° C. or higher and an intrinsic viscosity $[\eta]$ in decalin solvent at 135° C. of 0.5 to 25 dl/g.

Examples of the unsaturated carboxylic acid or a derivative thereof to be graft copolymerized to the above poly(4-methyl-1-pentene) are unsaturated carboxylic acids such as acrylic acid, maleic acid, fumaric acid, tetrahydrophthalic acid, itaconic acid, citraconic acid, crotonic acid, isocrotonic acid, Nadic acid (trade mark for endocis-bicyclo[2,2,1]hepto-5-ene-2,3-dicarboxylic acid), or derivatives thereof, such as acid halides, amides, imides, anhydrides, and esters, including specifically, malenyl chloride, maldimide, maleic anhydride, citraconic anhydride, monomethyl maleate, dimethyl maleate, and glycidyl maleate. Among the above-mentioned unsaturated dicarboxylic acids or acid anhydrides thereof, particularly maleic acid and nadic acid or acid anhydrides thereof are preferable.

When preparing a modified product by graft copolymerizing a graft monomer selected from unsaturated carboxylic acids or derivatives thereof with the above poly(4-methyl-1-pentene), various methods known in the art can be employed. For example, a method in which the poly(4-methyl-1-pentene) is melted and a graft monomer is added to be graft polymerized thereon, or a method in which it is dissolved in a solvent and a graft monomer is added to effect graft copolymerization can be used. In either case, to efficiently graft copolymerize the above-mentioned graft monomer, preferably the reaction is carried out in the presence of a radical initiator. The graft reaction is generally carried out at a temperature of 60° to 350° C. The ratio of the radical initiator employed may be generally in the range from 0.001 to 1 part by weight, based on 100 parts by weight of the poly(4-methyl-1-pentene). Examples of the radical initiator, are organic peroxides, organic peresters, and alternatively, azo compounds. Among these radical initiators, dialkylperoxides such as dicumyl peroxide, di-tert-butyl peroxide, 2,5-dimethyl-2,5-di(tert-butylperoxy)hexine-3, 2,5-dimethyl-2,5-di(tert-butylperoxy)hexane, 1,4-bis(tert-butylperoxyisopropyl)benzene, are preferred.

The graft-modified poly(4-methyl-1-pentene) constituting the composition of the present invention may be one wholly graft-modified with an unsaturated carboxylic acid, provided that the grafted amount of the unsaturated carboxylic acid or a derivative thereof is within the range as specified above. Alternatively, it may be a mixture of the poly(4-methyl-1-pentene) with an unmodified poly(4-methyl-1-pentene); namely, a partially modified graft-modified poly(4-methyl-1-pentene). When mixed with an unmodified poly(4-methyl-1-pentene), a graft-modified poly(4-methyl-1-pentene) also may be used at a slightly higher concentration, generally up to 25% by weight, so long as the grafted amount of the unsaturated carboxylic acid in the mixed state falls within the above-mentioned range.

In the present invention, during the preparation of the laminated plate and the prepreg, a film of a resin comprising the graft-modified poly(4-methyl-1-pentene) is used, and this film can be molded by a known method.

The reinforcing fibers usable in the present invention are not particularly limited, and those conventionally used in this kind of laminated plate can be used, but particularly, glass (including quartz) fibers and aramide fibers are preferred. These reinforcing fibers may be used in the form of sheets such as cloth and nonwoven cloth.

The present invention is now described with reference to the drawings. FIG. 1 is a sectional view showing an example of the laminated plate for a high frequency.

The laminated plate 1 for a high frequency of the present invention comprises a conductor layer 5, such as copper foil, bonded by lamination to an outermost layer of the reinforced plastic layer 4 having the resin 2 comprising the above-mentioned graft-modified poly(4-methyl-1-pentene) impregnated into the reinforcing fibers 3. The reinforced plastic layer 4 preferably comprises a laminate of two or more layers of the reinforcing fibers 3 impregnated with the resin 2. The conductor layer 5 may be laminated on both surfaces or on only one surface. When laminated on one surface, another metal such as iron or aluminum can be laminated on the opposite surface, for reinforcement.

The laminated plate 1 of the present invention also can be prepared in the same manner as in the prior art method, but is desirably prepared according to the method, according to the present invention.

Figure 2:
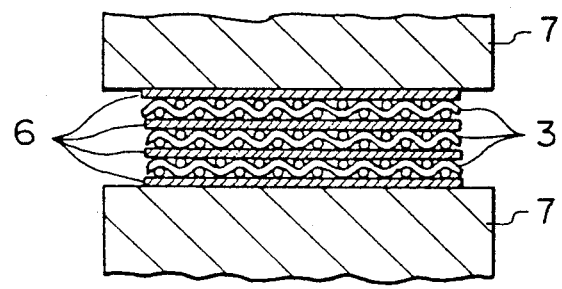

That is, in the preparation method of the present invention, first, as shown in FIG. 2, films 6 of the resin 2 comprising the above-mentioned graft-modified poly(4-methyl-1-pentene) and the reinforcing fibers 3 are alternately laminated so that a film 6 becomes the outermost layer, followed by heating and pressurization by hot press plates 7. Accordingly, the resin forming the film 6 is softened and melted and impregnated into the reinforcing fibers 3, to thereby form a prepreg 8.

The reinforcing fibers 3 can be formed by laminating, for example, 3 to 5 sheets of cloth or nonwoven fabric with a thickness of 50 to 200 μm, depending on the thickness of the desired prepreg 8. Also, films 6 with a thickness of 50 to 200 μm can be used and laminated to a thickness slightly thicker than that of the desired prepreg 8.

The conditions for heating and pressurization may be such that the resin 2 is completely melted by preheating at a molding temperature of 250° to 350° C. for 3 to 10 minutes under a pressure of, for example, 3 to 10 kg/cm$^2$, and then a pressure of 30 to 70 kg/cm$^2$ and a release of that pressure are repeated 10 to 30 times to effect defoaming while permitting excessive resin to flow out, curing by heating under a pressure of 30 to 70 kg/cm$^2$ for 2 to 10 minutes, and cooling while the above pressure is applied for 2 to 10 minutes, followed by taking-out the prepreg 8.

Figure 3:
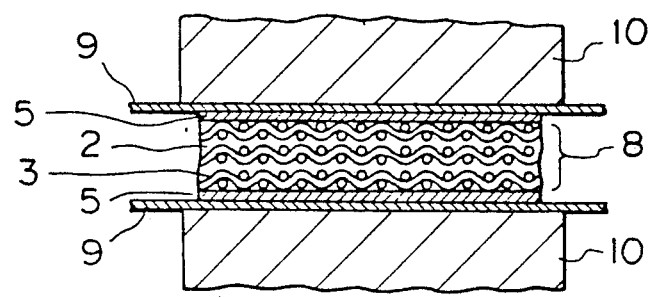

Next, as shown in FIG. 3, one or more sheets of the prepreg 8 are laminated, and the conductor layer 5 of 10 to 20 μm is laminated on one side or both sides of the outermost layer thereof, and further, the mold release film 9, such as an aluminum foil comprising a mirror surface plate, is superimposed on the outside thereof, followed by heating and pressurization while sandwiched between the press heating plates 10 comprising the mirror surface plates, and thus the resin of the prepreg 8 is softened and melted to adhere with the conductor layer 5.

The heating and pressurization conditions at this time may be such that the molding temperature is 250° to 350° C., and to prevent a breakage of the conductor layer 5 due to the difference in thermal expansion of the conductor layer 5 and the prepreg 8, pre-heating is conducted under a non-pressurized state for 3 to 10 minutes to completely melt the resin, followed by defoaming and pressure curing under the same conditions as when forming the prepreg. Cooling may be effected under a pressure of 70 to 120 kg/cm$^2$ for 10 to 30 seconds, and the laminated plate 1 taken out before the resin protruding into the mold release film 9 is adhered thereto and solidified, and the mold release film 9 quickly peeled off.

In the laminated plate 1 thus obtained, the resin 2 is uniformly impregnated throughout the reinforcing fibers 3, and the conductor layer 5 is firmly bonded thereto even though an adhesive is not used. When molding is performed in one step by laminating the resin 2, the reinforcing fibers 3, and the conductor layer 5 at the same time, wrinkles are generated on the semiconductor layer 5, but these wrinkles can be prevented by bonding the conductor layer after forming the prepreg as described above. The laminated plate is taken out and cut to the required sizes, to provide products.

The laminated plate for a high frequency of the present invention has excellent high frequency characteristics, such as a dielectric constant and dielectric loss, and can be utilized as an electrical circuit substrate and a flat antenna.

The laminated plate for a high frequency of the present invention, which employs a reinforced plastic having a resin comprising a graft-modified poly(4-methyl-1-pentene) impregnated into reinforcing fibers, has a good impregnation of and adhesiveness to the reinforcing fibers, and therefore, the resin can be impregnated uniformly and the conductor layer can be bonded without the use of an adhesive, and further, the laminated plate with two or more layers of reinforcing fibers laminated together has an excellent flexural strength and flexural modulus.

Also, in the preparation process of the present invention, the film of the above resin and the reinforcing fibers are laminated and heated under pressure to form a prepreg before bonding the conductor layer thereto by lamination, whereby a prepreg uniformly impregnated with the resin can be easily formed, and a laminated plate without wrinkles on the conductor layer can be produced at a high efficiency.

EXAMPLES

The present invention will now be further illustrated by, but is by no means limited to, the following Examples.

EXAMPLES 1 to 3

A resin film (thickness 100 μm) comprising a 95/5 (weight ratio) mixture of a poly(4-methyl-1-pentene) and a maleic acid modified poly(4-methyl-1-pentene), and a glass cloth (produced by Nitto Boseki K.K., WEA 116E, thickness 100 μm, unit area weight 105 g/m$^2$, density 60×58/25 mm, diameter of fiber 7 μm) were laminated so that the resin film became the outermost layer, and then sandwiched between press heating plates. The composite was then pre-heated at a molding temperature of 290° C. under a pressure of 5 kg/cm$^2$ for 6 minutes, and then an application of a pressure of 50 kg/cm$^2$ and a release from that pressure was repeated 20 times to effect defoaming, pressure curing was effected under a pressure of 50 kg/cm$^2$ for 4 minutes, followed by cooling under a pressure of 50 kg/cm$^2$ for 5 minutes, to prepare a prepreg.

Next, copper foils each 35 μm thick were laminated onto both sides of the above-mentioned prepreg, and further sandwiched between pressing hot plates through a mold release film comprising an aluminum foil. At a molding temperature of 290° C., the composite was preheated under a no-pressure condition for 6 minutes, and then subjected to defoaming and pressure curing under the same conditions as described above, followed by cooling under a pressure of 100 kg/cm$^2$ for 15 to 20 seconds. After taking out, the mold release film was peeled off and a laminated plate was obtained.

COMPARATIVE EXAMPLES 1 TO 3

A laminated plate was obtained under the same conditions except for using a resin comprising only a poly(4-methyl-1-pentene) containing no maleic acid modified resin.

The characteristic values of the laminated plates were measured, and the results are shown in Table 1.

TABLE 1

| | Example | | | Comparative Example | | |
|---|---|---|---|---|---|---|
| | Number of reinforcing fiber sheets laminated | | | Number of reinforcing fiber sheets laminated | | |
| | 1 | 2 | 3 | 1 | 2 | 3 |
| Specific gravity | 0.868 | 0.930 | 0.985 | 0.864 | 0.933 | 0.984 |
| ξ (1 MHz) | 2.32 | 2.43 | 2.49 | 2.33 | 2.45 | 2.51 |
| tan δ (1 MHz) | $3.35 \times 10^{-4}$ | $3.03 \times 10^{-4}$ | $2.37 \times 10^{-4}$ | $1.75 \times 10^{-5}$ | $6.93 \times 10^{-5}$ | $9.87 \times 10^{-5}$ |
| Volume resistivity (Ω · cm) | $1.90 \times 10^{17}$ | $2.63 \times 10^{17}$ | $6.10 \times 10^{16}$ | $2.49 \times 10^{17}$ | $2.85 \times 10^{17}$ | $3.11 \times 10^{17}$ |
| Surface resistance (Ω) | $6.83 \times 10^{17}$ | $8.35 \times 10^{17}$ | $5.88 \times 10^{17}$ | $9.94 \times 10^{17}$ | $7.63 \times 10^{18}$ | $1.66 \times 10^{18}$ |
| Water absorption (%) | 0.043 | 0.018 | 0.023 | 0.035 | 0.029 | 0.043 |
| Thermal expansion ratio (20-150° C.) X ($10^{-5}$/°C.) | — | — | — | — | — | — |
| Y ($10^{-5}$/°C.) | — | — | — | — | — | — |
| Z ($10^{-5}$/°C.) | 15 | 22 | 28 | 14 | 22 | 15 |
| Flexural strength (kg/cm$^2$) | 400 | 790 | 1060 | 465 | 670 | 825 |
| Flexural modulus (kg/cm$^2$) | 17200 | 24000 | 36400 | 17600 | 23700 | 29300 |

As apparent from the results shown in Table 1, the products of the Examples have electrical characteristics substantially equal to those of the Comparative Examples. Although the Examples have a higher tan δ value, a substantially equal value can be obtained when an adhesive is used to enhance the adhesive strength in the Comparative Examples. Conversely, it can be understood that the flexural strength and flexural modulus will become greater as the number of laminated sheets is increased.

We claim:

1. A laminated plate for a high frequency comprising a reinforced plastic layer and a conductive layer, said reinforced plastic layer comprising reinforcing fibers impregnated with poly(4-methyl-1-pentene) resin, said poly(4-methyl-1-pentene) being at least partially graft modified with an unsaturated carboxylic acid or a derivative thereof.

2. A laminated plate as claimed in claim 1, wherein said reinforced plastic layer comprises a laminate of two or more layers of reinforcing fibers impregnated with said resin.

3. A laminated plate as claimed in claim 1, wherein said unsaturated carboxylic acid or a derivative thereof is selected from the group consisting of acrylic acid, maleic acid, fumaric acid, tetrahydrophthalic acid, itaconic acid, citraconic acid, crotonic acid, isocrotonic acid, and nadic acid, and halides, amides, imides, anhydrides and esters thereof.

4. A laminated plate as claimed in claim 1, wherein said reinforcing fibers are glass fibers or aramide fibers.

5. A laminated plate as claimed in claim 1, wherein the grafted amount of the unsaturated carboxylic acid or the derivative thereof is 0.5% to 10% by weight, based upon the total weight of the at least partially graft-modified poly(4-methyl-1-pentene).

6. A laminated plate as claimed in claim 1, wherein the intrinsic viscosity [η] of the graft-modified poly(4-methyl-1-pentene) is 0.3 to 10 dl/g in decalin at 135° C.

7. A laminated plate as claimed in claim 1, wherein the poly(4-methyl-1-pentene) is selected from the group consisting of homopolymers of 4-methyl-1-pentene and copolymers of 4-methyl-1-pentene with another α-olefin having 2 to 20 carbon atoms, all having a melting point of 230° C. or higher and an intrinsic viscosity [η] in decalin at 135° C. of 0.5 to 25 dl/g.

* * * * *